(12) United States Patent  
Ishinaga

(10) Patent No.: US 6,476,410 B2
(45) Date of Patent: Nov. 5, 2002

(54) BACKSIDE LIGHT EMITTING CHIP TYPE LIGHT EMITTING ELEMENT AND INSULATING SUBSTRATE THEREFOR

(75) Inventor: Hiroki Ishinaga, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 09/848,369

(22) Filed: May 4, 2001

(65) Prior Publication Data

US 2001/0042858 A1 Nov. 22, 2001

(30) Foreign Application Priority Data

May 18, 2000 (JP) ........................................ 2000-146631

(51) Int. Cl.7 ........................ H01L 29/06; H01L 31/072; H01L 31/109; H01L 31/0328; H01L 31/0336
(52) U.S. Cl. .............................. 257/13; 257/88; 257/89; 438/22
(58) Field of Search .............................. 257/88, 89, 99, 257/13, 91; 438/22

(56) References Cited

U.S. PATENT DOCUMENTS

| 5,155,476 A | | 10/1992 | Shioji |
| 5,184,114 A | | 2/1993 | Brown |
| 5,841,177 A | * | 11/1998 | Komoto .................... 257/88 |
| 5,942,770 A | * | 8/1999 | Ishinaga et al. ............ 257/89 |
| 6,093,940 A | * | 7/2000 | Ishinaga et al. ............ 257/99 |

FOREIGN PATENT DOCUMENTS

TW            2180310            3/1992

* cited by examiner

Primary Examiner—David Nelms
Assistant Examiner—Andy Huynh
(74) Attorney, Agent, or Firm—Rader, Fishman & Grauer PLLC

(57) ABSTRACT

A backside light emitting chip type light emitting element having at least three internal electrodes and at least three external electrodes electrically connected to the internal electrodes respectively on one principal surface of an insulating substrate, and at least two light emitting chips connected to the internal electrodes. The light emitting chips may emit light of different colors, respectively.

7 Claims, 9 Drawing Sheets

BACKSIDE LIGHT EMITTING CHIP TYPE LIGHT EMITTING ELEMENT AND INSULATING SUBSTRATE THEREFOR

BACKGROUND OF THE INVENTION

1. Field of the invention

The present invention relates to a backside light emitting chip type light emitting element to be incorporated in various kinds of thin type machinery and tools.

2. Description of Related Art

FIG. 7 is a schematic sectional view of a conventional backside light emitting chip type light emitting element, and FIG. 8 is a schematic plan view of the same. A pair of internal electrodes 52r, 52l are formed in the inner region on one principal surface of a rectangular insulating substrate 51. A light emitting chip 54 is die-bonded on one internal electrode 52r. The light emitting chip 54 and the other internal electrode 52l are electrically connected to each other by a bonding wire 55. On the principal surface of the insulating substrate 51, a region including the light emitting chip 54, the bonding wire 55, and the connecting portion of the bonding wire 55 on the internal electrode 52l is protected by a light-permeable member 56.

External electrodes 53r, 53l are formed on the opposed end side sections of the insulating substrate 51 so as to extend from the principal surface of the insulating substrate 51 over the side faces thereof, respectively. The internal electrodes 52r, 52l are connected to the external electrodes 53r, 53l in the vicinity of the end sections of the insulating substrate 51, respectively.

Electrode pads 58 are formed at predetermined positions on a wiring substrate 57 on which the above-mentioned backside light emitting chip type light emitting element is mounted. The electrode pads 58 and the external electrodes 53r, 53l of the backside light emitting chip type light emitting element are bonded to one another by solders 59. Since the external electrodes 53r, 53l are formed over the two surfaces, i.e. the above-mentioned surface and the side face of the insulating substrate 51, the light emitting element is supported by the solders 59 at the upper surface and the side faces thereof.

A through hole 60 is provided in the wiring substrate 57, and the backside light emitting chip type light emitting element is supported in such a manner that the light-permeable member 56 section thereof is inserted into the through hole 60. Accordingly, light emitted by the backside light emitting chip type light emitting element is visible in the direction of an arrow A shown in FIG. 7, i.e. from the opposite side of the mounting surface 57a of the wiring substrate 57.

In such a conventional backside light emitting chip type light emitting element as mentioned above, only one light emitting chip 54 is mounted. Therefore, only one kind of emitted light having a fixed color and brightness can be obtained.

On the other hand, when a plurality of insulating substrates 51 are manufactured at a time, individual pieces of insulating substrates 51 are cut out of a large original insulating substrate as shown in FIG. 9. In the original substrate, individual regions 51A (one individual region 51A is shown with hatching in FIG. 9) corresponding to individual pieces of insulating substrates 51 are disposed laterally in close contact with one another and longitudinally in arrangement with slit-shaped spaces B therebetween. The plurality of individual regions 51A constitute a large sheet of substrate supported by a frame section 51B.

The spaces B are required for forming external electrodes 53 by plating or the like on the side faces 51a of the insulating substrates 51. It is also a disadvantage of such a conventional art that, because of providing the spaces B, only a decreased number of individual pieces of insulating substrates 51 can be cut out from a large original insulating substrate.

SUMMARY OF THE INVENTION

An object of the present invention is to provide a backside light emitting chip type light emitting element capable of emitting light of two or more kinds of colors, and an insulating substrate used therefor.

Another object of the present invention is to provide a backside light emitting chip type light emitting element having an electrode arrangement capable of obtaining a stable bonding strength when it is mounted on a wiring substrate, and an insulating substrate used therefor.

A backside light emitting chip type light emitting element according to the present invention includes an insulating substrate, at least three internal electrodes formed on one principal surface of the insulating substrate, at least three external electrodes formed on the one principal surface of the insulating substrate and electrically connected to the at least three internal electrodes, and at least two light emitting chips electrically connected to the internal electrodes.

With this structure, by mounting at least two light emitting chips, light of two or more kinds of colors can be emitted. For example, by using light emitting chips having different emission colors respectively and selectively causing one or more of the light emitting chips to emit light, light of two or more colors can be observed. Further, by using a plurality of light emitting chips having the same emission color and changing the number of the light emitting chips emitting light at the same time, the brightness of the emitted light can be changed.

The insulating substrate may be formed substantially rectangular. In this case, the external electrodes can be formed at the corner portions, or a part or the whole of the side sections of the insulating substrate.

In an embodiment of the present invention, the insulating substrate is substantially rectangular, and the external electrodes are formed at at least three corner portions of the insulating substrate, respectively. By forming the external electrodes at the corner portions of the substantially rectangular insulating substrate, the insulating substrate can be strongly bonded to electrode pads provided on a wiring substrate.

Further, in an embodiment of the present invention, one-fourth through holes each having electrically conductive inner wall are formed at the at least three corner portions of the insulating substrate, respectively. Thereby, when the insulating substrate is bonded to a wiring substrate, the insulating substrate is supported also from the side face, so that the bonding strength can become stable. Preferably, the inner wall of each one-fourth through hole is provided with conductivity by the use of a metal material having a favorable solder wetting property.

When manufacturing a backside light emitting chip type light emitting element of the present invention, in the step of cutting out a plurality of individual pieces of insulating substrates each usable for the light emitting element from a larger insulating substrate, through holes are formed in the larger insulating substrate and the inner walls of the through holes are treated so as to become conductive. Then, by cutting the plurality of insulating substrates out of the larger insulating substrate in such a manner that each through hole can be divided into quarters, one-fourth through holes can be formed. By utilizing this, individual regions corresponding to the individual pieces of insulating substrates to be cut out can be disposed in close contact with one another in a larger insulating substrate. As a result, the number of the insulating substrates obtainable from a larger insulating substrate having a predetermined area can be increased.

An inventive insulating substrate used for a backside light emitting chip type light emitting element is formed with at least three internal electrodes and at least three external electrodes connected to the internal electrodes on one principal surface thereof. The external electrodes are disposed on the peripheral part side of the insulating substrate with respect to the internal electrodes.

Such an insulating substrate is usable for the above-mentioned backside light emitting chip type light emitting element.

The insulating substrate used for the backside light emitting chip type light emitting element may be formed to be substantially rectangular. In this case, it is preferable that the external electrodes are formed at at least three corner portions of the insulating substrate, respectively.

The foregoing and other objects, features, aspects and advantages of the present invention will become more apparent from the following detailed description of embodiments of the present invention given with the accompanying drawings.

DESCRIPTION OF THE PREFERRED EMBODIMENTS

Figure 1:
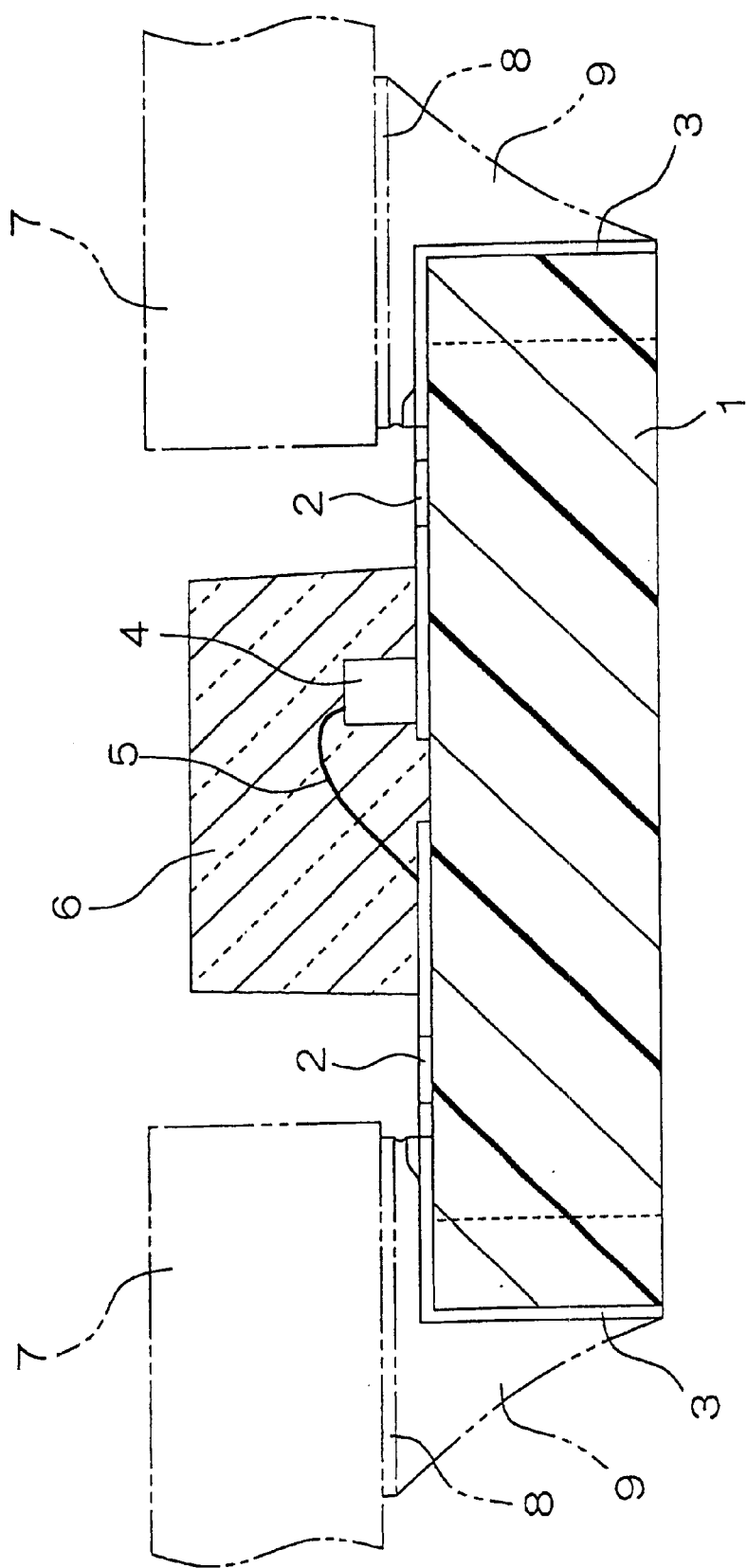
FIG. 1 is a schematic sectional view of a backside light emitting chip type light emitting element according to a first embodiment of the present invention.
Figure 2:
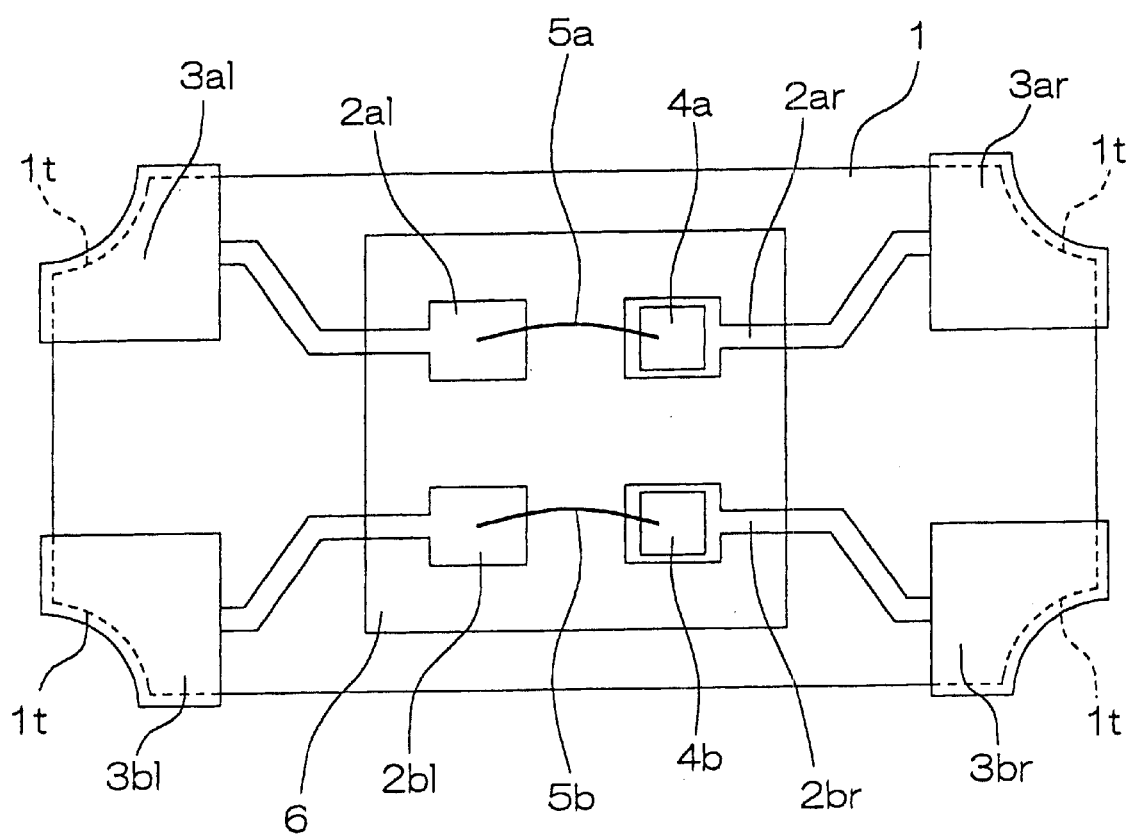
FIG. 2 is a schematic plan view of the backside light emitting chip type light emitting element of the first embodiment.

FIG. 1 is a schematic sectional view of a backside light emitting chip type light emitting element according to a first embodiment of the present invention. FIG. 2 is a schematic plan view of the light emitting element.

Two pairs of internal electrodes 2ar, 2al, 2br, 2bl (designated generally with a reference number "2" in FIG. 1) are formed in the inner region on one principal surface of a substantially rectangular insulating substrate 1.

A light emitting chip 4a is die-bonded on the internal electrode 2ar. The light emitting chip 4a and the internal electrode 2al are connected to each other by a bonding wire 5a. Similarly, a light emitting chip 4b is die-bonded on the internal electrode 2br, and the light emitting chip 4b and the internal electrode 2bl are connected to each other by a bonding wire 5b. The light emitting chips 4a, 4b (designated generally with a reference number "4" in FIG. 1) emit light of different colors, respectively.

On the principal surface of the insulating substrate 1, the light emitting chips 4a, 4b, the bonding wires 5a, 5b (designated generally with a reference number "5" in FIG. 1), the connecting portion of the internal electrode 2al and the bonding wire 5a, and the connecting portion of the internal electrode 2bl and the bonding wire 5b are covered and protected by a light-permeable member 6.

External electrodes 3ar, 3al, 3br, 3bl (designated generally with a reference number "3" in FIG. 1) are formed at the four corner portions on the principal surface of the substantially rectangular insulating substrate 1, respectively. Further, at each of the four corner potions of the insulating substrate 1, a one-fourth through hole is formed. The inner surface 1t of each one-fourth through hole is made to be electrically conductive and continued from the principal surface of the substrate 1 to form a part of each of the external electrodes 3ar, 3al, 3br, 3bl. In other words, each of the external electrodes 3ar, 3al, 3br, 3bl extends from the one principal surface of the insulating substrate 1 over the inner surface 1t of each one-fourth through hole.

The four internal electrodes 2ar, 2al, 2br and 2bl are connected to the external electrodes 3ar, 3al, 3br and 3bl, respectively.

With the above-mentioned connections, the light emitting element 4a emits light when an electric current is supplied between the external electrodes 3ar and 3al, and the light emitting chip 4b emits light when an electric current is supplied between the external electrodes 3br and 3bl. Since the two light-emitting chips 4a, 4b respectively emit light of different colors, emitted light of two colors can be obtained by selectively supplying an electric current through one of the two light emitting chips 4a, 4b. Further, by simultaneously supplying electric currents through the two light emitting chips 4a, 4b, light of a mixed color can be observed which is different from each color of the light individually emitted by the light emitting chip 4a or 4b.

Electrode pads 8 are formed at predetermined positions on a wiring substrate 7 on which the above-mentioned backside light emitting chip type light emitting element is mounted (see FIG. 1). The electrode pads 8 and the corresponding external electrodes 3ar, 3al, 3br, 3bl of the backside light emitting chip type light emitting element are bonded to one another by solders 9. Therefore, the backside light emitting chip type light emitting element is supported by the solders 9 at the principal surface portions and the side face portions of the insulating substrate 1 at the four corner portions.

Figure 3:
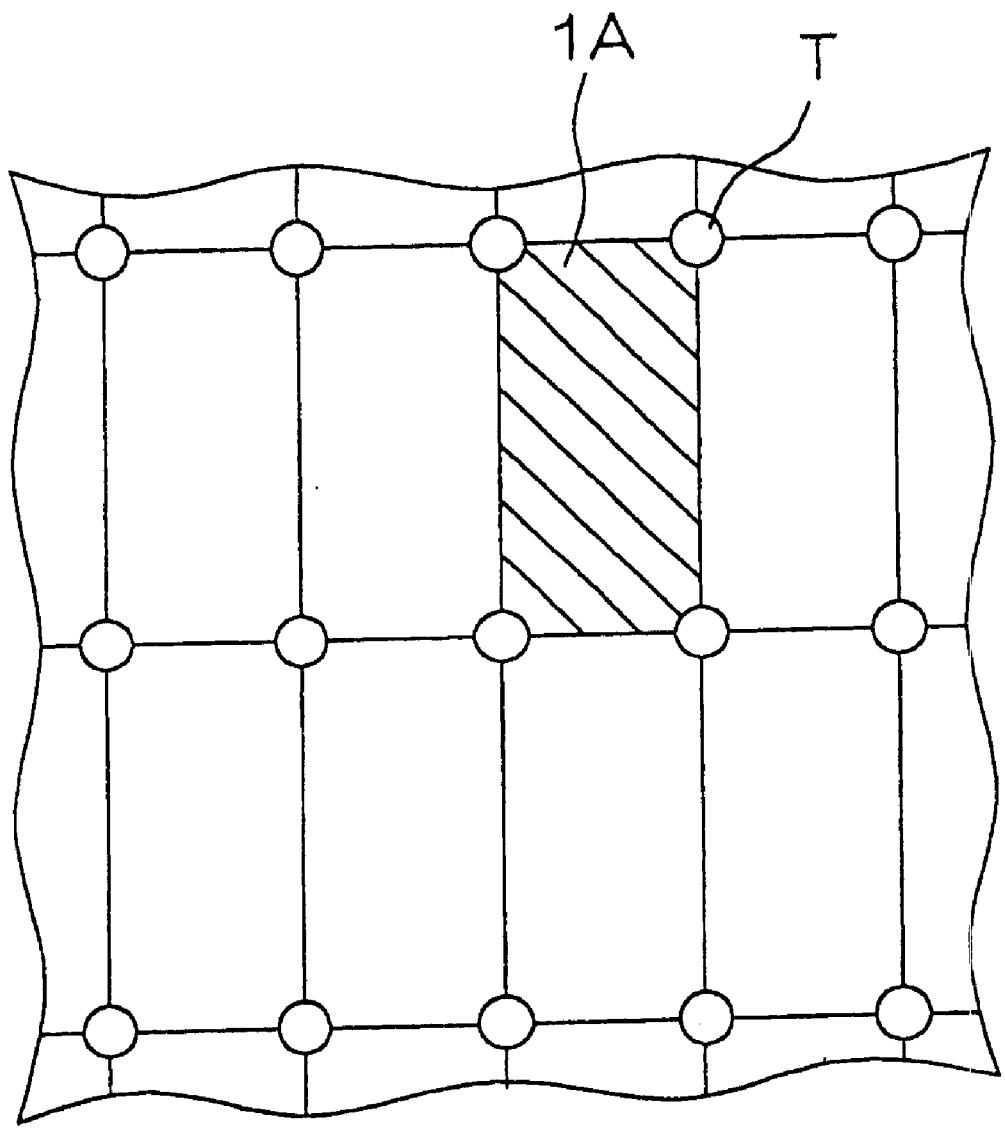
FIG. 3 is a schematic sectional view of a large original insulating substrate from which a plurality of insulating substrates according to the first embodiment are cut out.

FIG. 3 is a schematic plan view of a large original insulating substrate from which a plurality of insulating substrates 1 used for this embodiment are manufactured at a time. Individual regions 1A (one individual region 1A is shown with hatching in FIG. 3) corresponding to individual pieces of insulating substrates 1 are disposed both longitudinally and laterally close contact with one another, and through holes T are formed at the corners of each individual region 1A. Consequently, by providing conductivity to the inner surfaces of the through holes T in the original insulating substrate and then cutting out individual pieces of insulating substrates, it is possible to obtain insulating substrates 1 each having, at its four corners, one-fourth through holes each provided with the external electrode 3ar, 3al, 3br or 3bl on its inner surface 1t.

Figure 9:
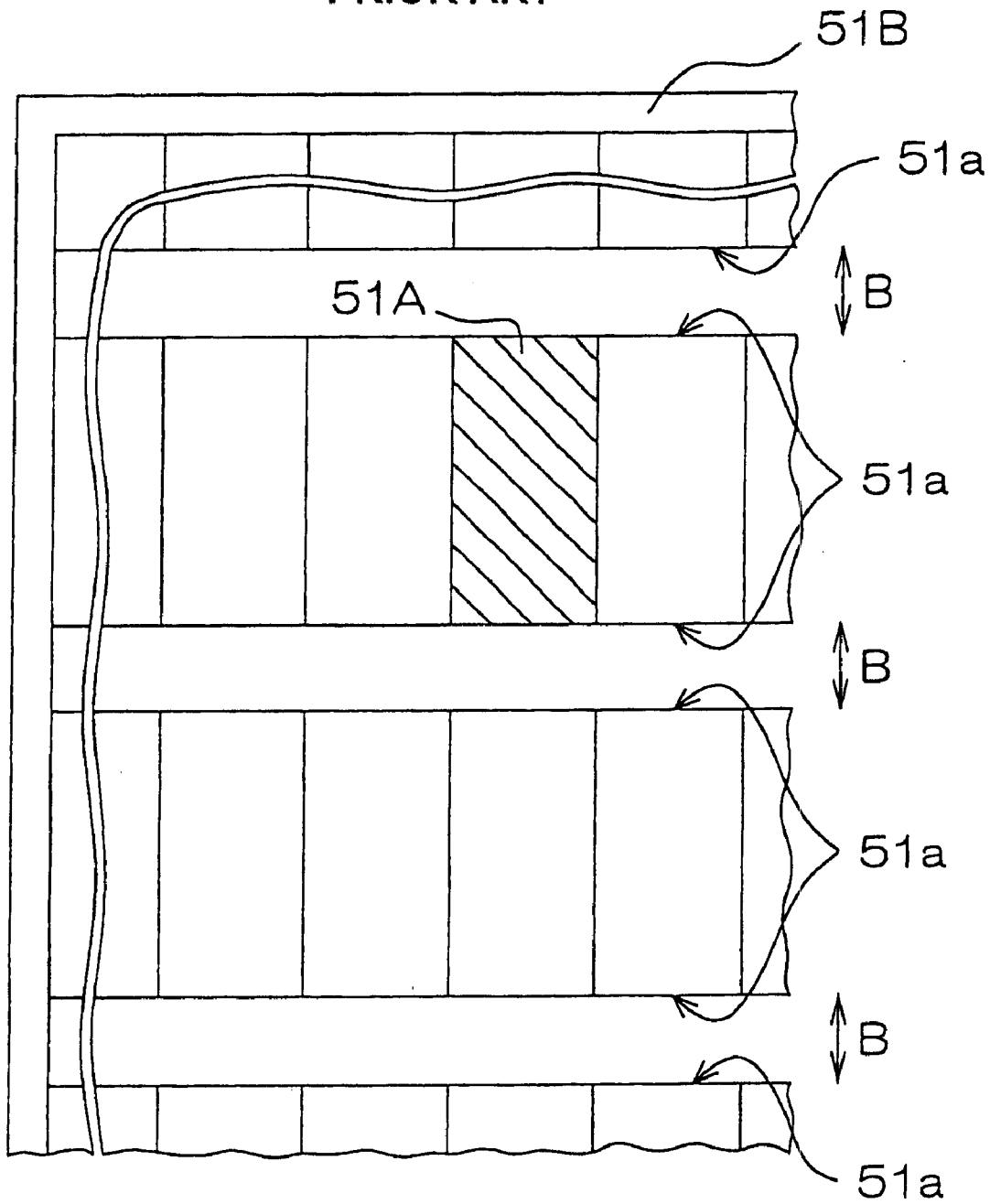
FIG. 9 is a schematic sectional view of a large original insulating substrate from which a plurality of insulating substrates used for the conventional backside light emitting chip type light emitting elements are cut out.

In other words, it is possible to form external electrodes 3ar, 3al, 3br, 3bl at the necessary portions of the original insulating substrate, without providing spaces (for example, space B in FIG. 9) used only for conductivity providing treatment. Accordingly, an increased number of individual pieces of insulating substrates 1 can be obtained from a large original insulating substrate.

Figure 4:
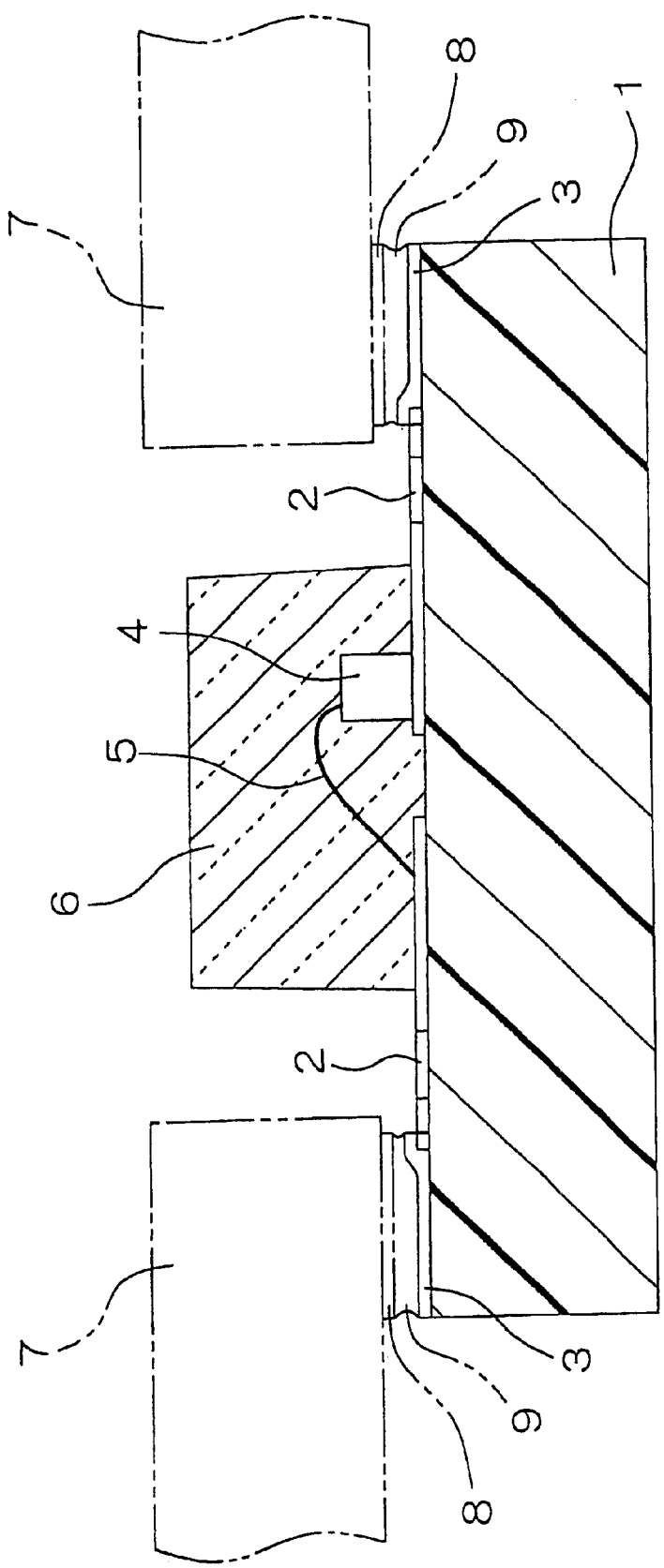
FIG. 4 is a schematic sectional view of a backside light emitting chip type light emitting element according to a second embodiment of the present invention.
Figure 5:
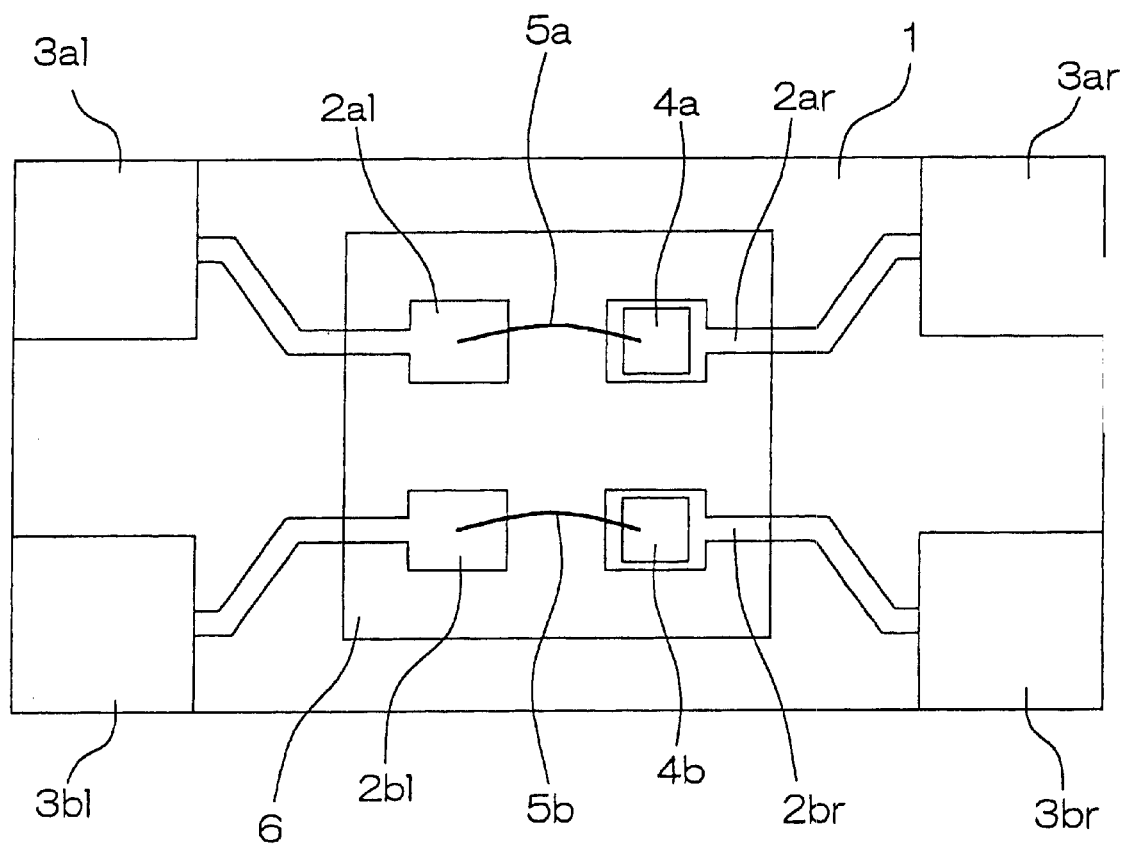
FIG. 5 is a schematic plan view of the backside light emitting chip type light emitting element of the second embodiment.

FIG. 4 is a schematic sectional view of a backside light emitting chip type light emitting element according to a second embodiment of the present invention, and FIG. 5 is a schematic plan view thereof. The light emitting element of this embodiment is similar to that of the first embodiment except the shape of the insulating substrate 1 and the arranging manner of the external electrodes. Therefore, the members shown in FIGS. 4, 5 corresponding to those shown in FIGS. 1, 2 are assigned the same reference numbers with those shown in FIGS. 1, 2.

Two pairs of internal electrodes 2ar, 2al, 2br, 2bl (designated generally with a reference number "2" in FIG. 4) are formed in the inner region on one principal surface of a rectangular insulating substrate 1.

A light emitting chip 4a is die-bonded on the internal electrode 2ar. The light emitting chip 4a and the internal electrode 2al are connected to each other by a bonding wire 5a. Similarly, a light emitting chip 4b is die-bonded on the internal electrode 2br, and the light emitting chip 4b and the internal electrode 2bl are connected to each other by a bonding wire 5b. The light emitting chips 4a, 4b (designated generally with a reference number "4" in FIG. 4) emit light of different colors, respectively.

On the principal surface of the insulating substrate 1, the light emitting chips 4a, 4b, the bonding wires 5a, 5b (designated generally with a reference number "5" in FIG. 4), the connecting portion of the internal electrode 2al and the bonding wire 5a, and the connecting portion of the internal electrode 2bl and the bonding wire 5b are covered and protected by a light-permeable member 6.

External electrodes 3ar, 3al, 3br, 3bl (designated generally with a reference number "3" in FIG. 4) are formed at the four corner portions on the principal surface of the rectangular insulating substrate 1. One-fourth through holes are not formed in the insulating substrate 1, and the external electrodes 3ar, 3al, 3br, 3bl are not formed on the side faces of the insulating substrate 1.

The four internal electrodes 2ar, 2al, 2br, 2bl are connected to the external electrodes 3ar, 3al, 3br, 3bl, respectively.

With the above-mentioned connections, the light emitting element 4a emits light when an electric current is supplied between the external electrodes 3ar and 3al, and the light emitting chip 4b emits light when an electric current is supplied between the external electrodes 3br and 3bl. Since the two light emitting chips 4a, 4b emit light of different colors, emitted light of two colors can be obtained by selectively supplying an electric current through one of the two light emitting chips 4a, 4b. Further, by simultaneously supplying electric currents through the two light emitting chips 4a, 4b, light of a mixed color can be observed which is different from each color of the light individually emitted by the light emitting chip 4a or 4b.

Electrode pads 8 are formed at predetermined positions on a wiring substrate 7 on which the above-mentioned backside light emitting chip type light emitting element is mounted (see FIG. 4). The electrode pads 8 and the corresponding external electrodes 3ar, 3al, 3br, 3bl of the backside light emitting chip type light emitting element are bonded to one another only on the corresponding surfaces by solders 9. In the case in which a high bonding strength is not necessary between the backside light emitting chip type light emitting element and the wiring substrate 7, such a bonding manner is allowable.

Figure 6:
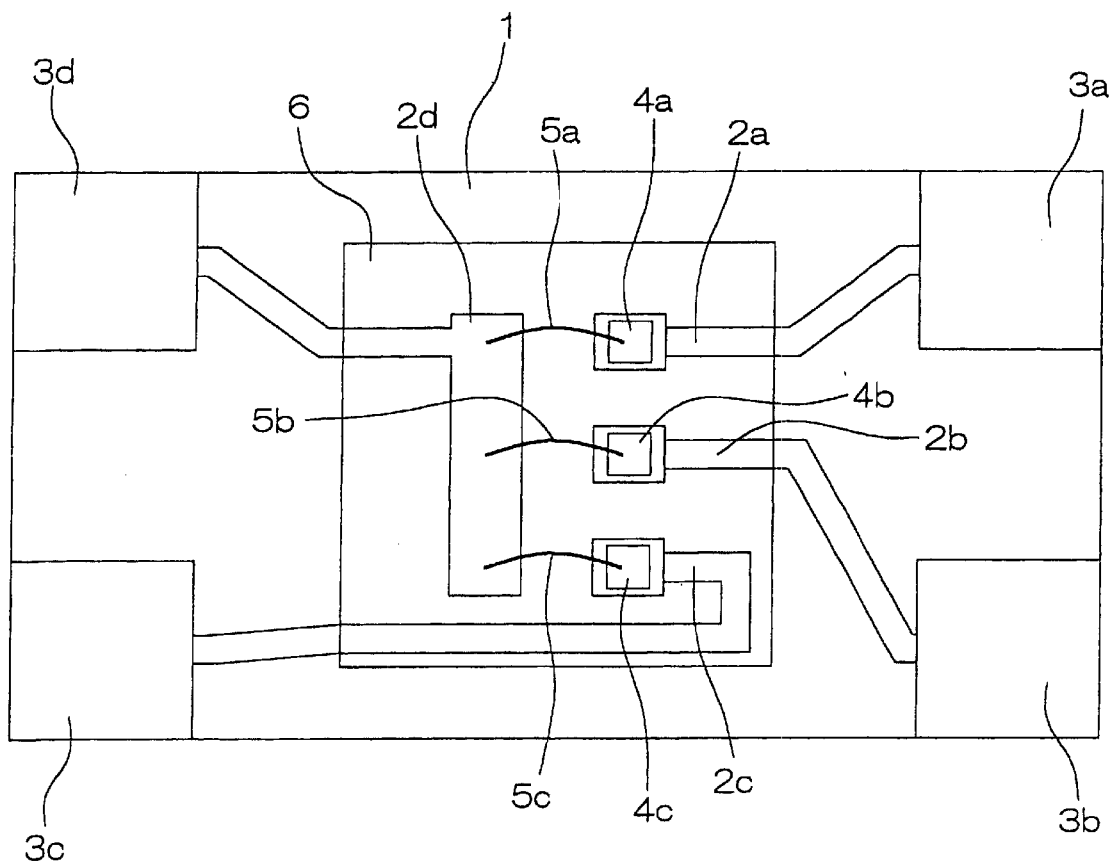
FIG. 6 is a schematic sectional view of a backside light emitting chip type light emitting element according to a third embodiment of the present invention.
Figure 7:
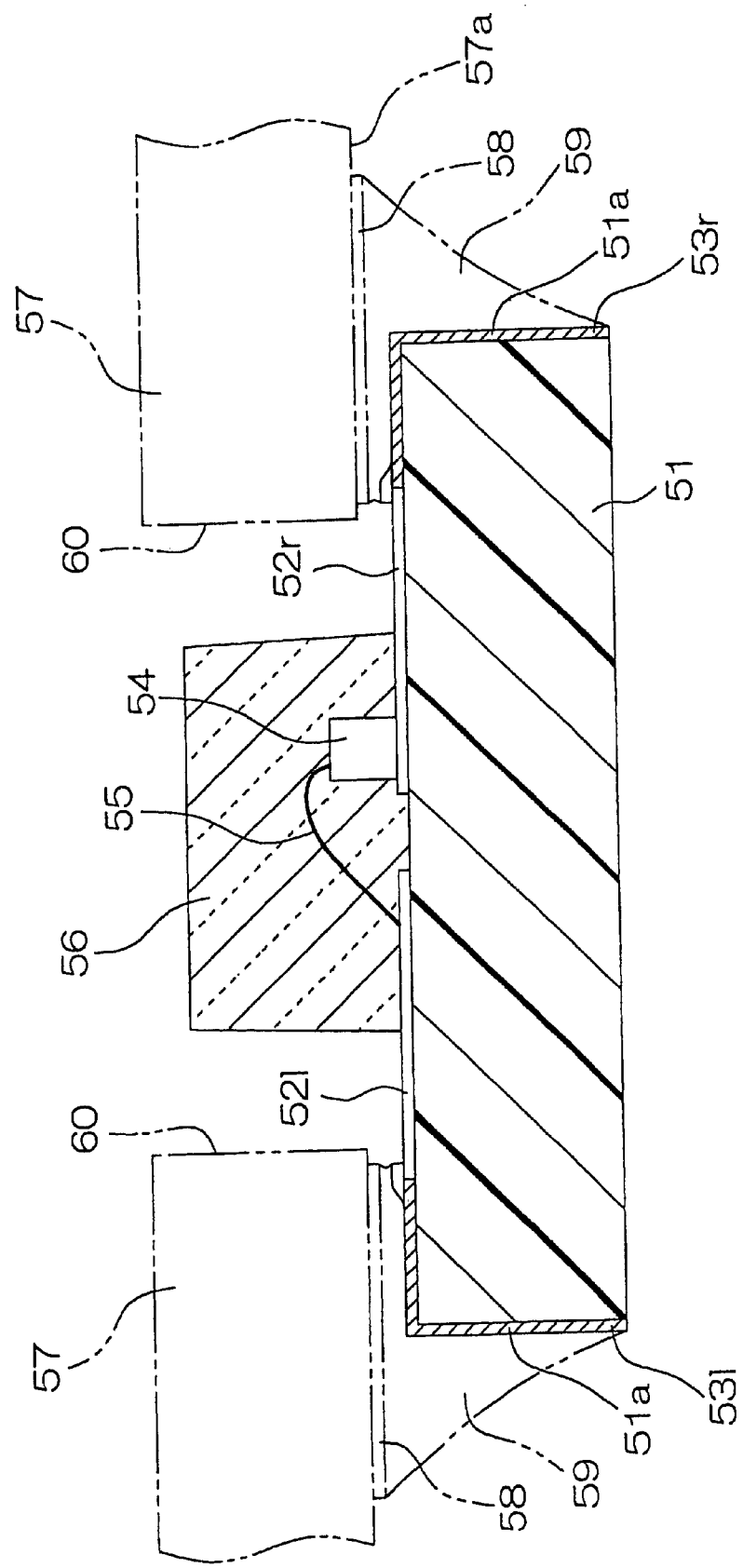
FIG. 7 is a schematic sectional view of the conventional backside light emitting chip type light emitting element.
Figure 8:
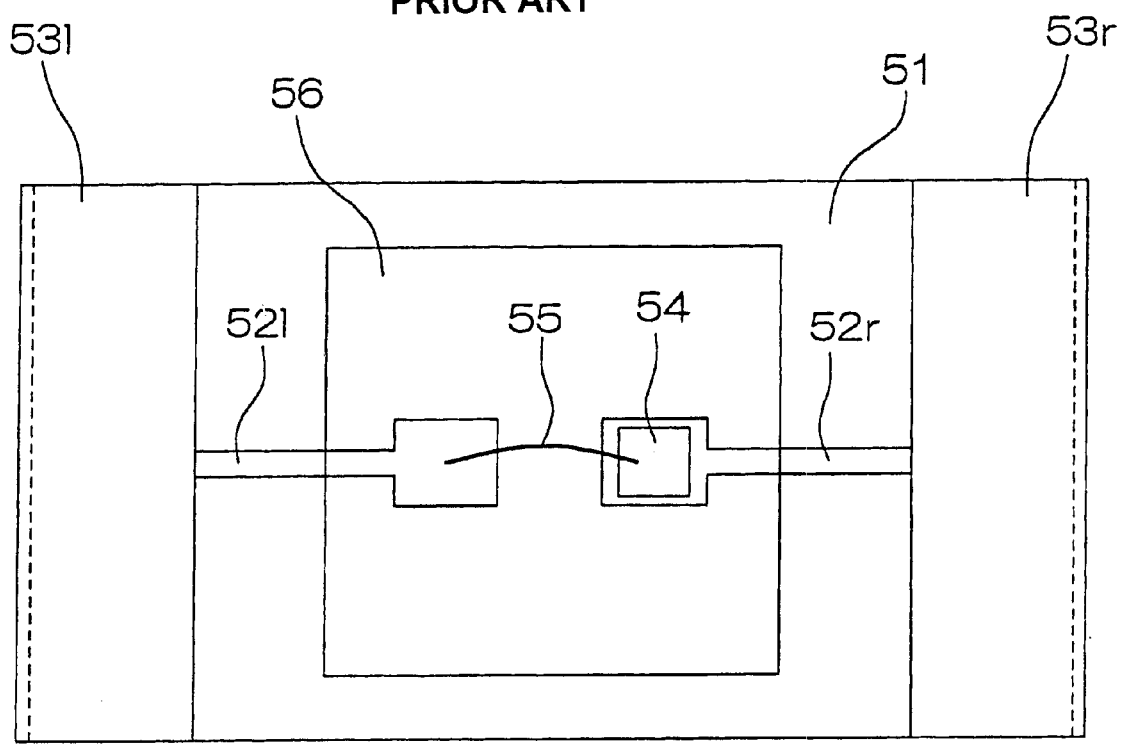
FIG. 8 is a schematic plan view of the conventional backside light emitting chip type light emitting element.

FIG. 6 is a schematic plan view of a backside light emitting chip type light emitting element according to a third embodiment of the present invention. In this embodiment, three light emitting chips 4a, 4b, 4c are provided with a backside light emitting chip type light emitting element.

Four internal electrodes 2a to 2d are formed in the inner region on one principal surface of a rectangular insulating substrate 1. Three light emitting chips 4a to 4c are die-bonded respectively to the three internal electrodes 2a to 2c of the four internal electrodes 2a to 2d. The light emitting chips 4a to 4c are aligned in a line. The remaining internal electrode 2d has a shape elongated in parallel with the direction of the alignment of the three light emitting chips 4a to 4c. The internal electrode 2d serves as a common electrode connected to the three light emitting chips 4a to 4c by the bonding wires 5a to 5c, respectively. The light emitting chips 4a to 4c emit light of different colors, respectively.

On the principal surface of the insulating substrate 1, the light emitting chips 4a to 4c, the bonding wires 5a to 5c, and the connecting portions of the internal electrode 2d and the bonding wires 5a, 5b and 5c are covered and protected by a light-permeable member 6.

External electrodes 3a to 3d are formed at the corner portions on the principal surface of the rectangular insulating substrate 1. One-fourth through holes are not formed in the insulating substrate 1, and the external electrodes 3a to 3d are not formed on the side faces of the insulating substrate 1.

The four internal electrodes 2a to 2d are connected to the four external electrodes 3a to 3d, respectively.

With the above-mentioned connections, the light emitting element 4a emits light when an electric current is supplied between the external electrodes 3a and 3d, the light emitting chip 4b emits light when an electric current is supplied between the external electrodes 3b and 3d, and the light emitting chip 4c emits light when an electric current is supplied between the external electrodes 3c and 3d. Since the three light emitting chips 4a to 4c emit light of different colors, emitted light of three colors can be obtained by selectively supplying an electric current through one of the three light emitting chips 4a to 4c. Further, by selectively and simultaneously supplying electric currents through two or more of the three light emitting chips 4a to 4c, light of a mixed color can be observed which is different from each color of the light individually emitted by the light emitting chip 4a to 4c. Accordingly, emitted light of seven colors in total can be observed.

As mentioned above, by packaging a plurality of light emitting chips 4, it is possible to obtain a backside light emitting chip type light emitting element capable of emitting light of two or more different colors. Such a backside light emitting chip type light emitting element can be realized by using an insulating substrate provided with sets of internal and external electrodes capable of mounting a plurality of light emitting chips.

Further, by using, in such a backside light emitting chip type light emitting element, a substantially rectangular insulating substrate 1 provided with external electrodes 3 for connection at the four corners thereof, a stable bonding strength can be obtained with respect to a wiring substrate 7.

In the above-mentioned embodiments, the plurality of light emitting chips packaged in a backside light emitting chip type light emitting element emit light of different colors, respectively. However, the light emitting chips may emit light of the same color. In this case, by changing the number of the light emitting chips through which electric currents are supplied at the same time, the brightness of the emitted light can be changed.

Further, in the above-mentioned embodiments, the external electrodes are provided only at the corner portions of the substantially rectangular insulating substrate. However, the external electrodes may be provided in a part or the whole of the side sections of the substantially rectangular substrate. When each external electrode is provided in a part of the side section of the insulating substrate, a one-second through hole may be provided in that part of the insulating substrate and the inner surface of the one-second through hole may be made conductive so as to serve as a part of the external electrode.

Furthermore, the above-mentioned third embodiment has a structure in which three light emitting chips are provided. This structure of the third embodiment is also applicable to a backside light emitting chip type light emitting element provided with two light emitting chips. In other words, in this case, a common internal electrode connected commonly to the two light emitting chips and two individual internal electrodes connected to the two light emitting chips respectively are provided, and external electrodes are connected to the common internal electrode and the two individual internal electrodes, respectively.

Although the present invention has been described and illustrated in detail, it is clearly understood that the same is by way of illustration and example only and is not to be taken by way of limitation, the spirit and scope of the present invention being limited only by the terms of the appended claims.

This application corresponds to the Japanese Patent Application No. 2000-146631 filed in the Japanese Patent Office on May 18, 2000, and the whole disclosure of the Japanese application is incorporated herein by reference.

What is claimed is:

1. A backside light emitting chip type light emitting element for use with a wiring substrate having a facially-opposing pair of wiring substrate surfaces, comprising:

an insulating substrate defining an insulating substrate surface, at least three internal electrodes formed on one principal surface of the insulating substrate, at least three external electrodes, formed on the one principal surface of the insulating substrate, which are electrically connected to the at least three internal electrodes, respectively, and at least two light emitting chips connected to the internal electrodes, wherein the light emitting element is bonded on one wiring substrate surface and emits light towards the other wiring substrate surface and the at least three internal electrodes have respective bonding surfaces bonded onto the insulating substrate surface where the at least two light emitting chips are bonded.

2. A backside light emitting chip type light emitting element as claimed in claim 1, in which the insulating substrate has a substantially rectangular shape, and the at least three external electrodes are formed at at least three corner portions of the insulating substrate, respectively.

3. A backside light emitting chip type light emitting element as claimed in claim 2, in which one-fourth through holes each having an electrically conductive inner wall are formed at the at least three corner portions of the insulating substrate, respectively.

4. A backside light emitting chip type light emitting element as claimed in claim 1, in which the at least two light emitting chips emit light of different colors, respectively.

5. A backside light emitting chip type light emitting element as claimed in claim 1, in which one terminal of each of the at least two light emitting chips is commonly connected to the same external electrode, and the other terminal thereof is connected to a different external electrode from one another.

6. An insulating substrate used for a backside light emitting chip type light emitting element and a wiring substrate having a facially-opposing pair of wiring substrate surfaces, in which at least three internal electrodes and at least three external electrodes connected to the internal electrodes, respectively, are formed on one principal surface of the insulating substrate, and the external electrodes are formed on a peripheral section side of the one principal surface of the insulating substrate with respect to the internal electrodes wherein the light emitting element is bonded on one wiring substrate surface and emits light towards the other wiring substrate surface and the at least three internal electrodes have respective bonding surfaces bonded onto the principal surface of the insulating substrate where the light emitting element is bonded.

7. An insulating substrate used for a backside light emitting chip type light emitting element as claimed in claim 6, in which the insulating substrate has a substantially rectangular shape, and the external electrodes are formed at at least three corner portions of the insulating substrate, respectively.

* * * * *